United States Patent
Chimura

(10) Patent No.: US 6,483,384 B1
(45) Date of Patent: Nov. 19, 2002

(54) HIGH SPEED AMPLIFIER

(75) Inventor: Tsuyoshi Chimura, Kawaguchi (JP)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 09/858,800

(22) Filed: May 16, 2001

(30) Foreign Application Priority Data

May 16, 2000 (JP) .......................................... 2000-142931

(51) Int. Cl.[7] .................................................. H03F 3/45
(52) U.S. Cl. ...................................... 330/257; 330/260
(58) Field of Search .............................. 330/257, 260, 330/261, 288

(56) References Cited

U.S. PATENT DOCUMENTS 5,818,295 A * 10/1998 Chimura et al. ............. 330/257
5,999,054 A * 12/1999 Suzuki ....................... 330/260
6,163,217 A * 12/2000 Matsubara et al. .......... 330/260

* cited by examiner

Primary Examiner—Robert Pascal
Assistant Examiner—Khanh Van Nguyen
(74) Attorney, Agent, or Firm—William B. Kempler; W. James Brady; Frederick J. Telecky, Jr.

(57) ABSTRACT

The object of this invention is to realize high-speed rise and/or fall characteristics for amplifier without increasing transistor size or current consumption. A first rise sensing circuit 42 and a second a sensing circuit 44 are connected to main circuit 40. The first sensing circuit 42 has a PMOS transistor which functions as a rise sensing transistor, a pair of NMOS transistors 48 and 50, which form a current-mirror circuit, and a PMOS transistor 52, which drives the PMOS transistor 46 used for speed up in main circuit 40. The second sensing circuit 44 has a PMOS transistor 54, which functions as a fall sensing transistor, a pair of NMOS transistors 56 and 58, which form a current-mirror circuit, and a PMOS transistor 60 used for driving the PMOS transistor used for speed up in main circuit 40.

20 Claims, 6 Drawing Sheets

HIGH SPEED AMPLIFIER

FIELD OF THE INVENTION

The present invention pertains to an amplifier, specifically, an operational amplifier.

BACKGROUND OF THE INVENTION

FIG. 10 shows the configuration of a conventional operational amplifier. Basically, the operational amplifier comprises differential input part 10 and output part 12.

Differential input part 10 comprises a pair of p-channel MOS transistors (referred to as PMOS transistors hereinafter) 14 and 16 which are differentially connected, a constant-current source circuit 18 which is connected to the source terminals of said two PMOS transistors 14 and 16, a current-mirror circuit comprised of a pair of n-channel MOS transistors (referred to as NMOS transistors hereinafter) 20 and 22 which are connected to the drain terminals of said pair of PMOS transistors 14 and 16.

In output part 12, NMOS transistor 24, constant-current source circuit 26, and PMOS transistor 28 comprise an output stage. NMOS transistors 30, 32, and 34, constant-current source circuit 36, and PMOS transistor 38 comprise an output control part for controlling the operation of the output stage, specifically, the operation of PMOS transistor 28 used for charging the load.

Since the output terminal OUT of output part 12 is connected in series with the gate terminal of PMOS transistor 16 or the inverting input terminal (−), the aforementioned operational amplifier acts like a sink type voltage follower (FIG. 11).

That is, when the voltage at the input terminal IN rises from the balanced state between the voltage at the input terminal IN and the voltage at the output terminal OUT, in differential input part 10, the drain current of PMOS transistor 14 decreases, while the drain current of PMOS transistor 16 increases by the same amount, and the potential at node Na drops. As a result, the drain current of NMOS transistor 24, used as a load to sink current in the output stage of output part 12, decreases. On the other hand, in the output control part, since the potential at the gate terminal of NMOS transistor 30 (potential at node Na) drops, its drain current decreases, and the potential at the drain terminal rises. Thus, the potential at the drain terminal of NMOS transistor 32, that is, the potential at the gate terminal of NMOS transistor 34, rises, and the drain current of NMOS transistor 34 increases. The drain current of PMOS transistor 28 in the current-mirror circuit comprising PMOS transistors 38 and 28 also increases. The drain current of said PMOS transistor 28 combines with the constant-current generated by constant-current source circuit 26 at the output terminal OUT to charge the load (not shown in the figure). When the voltage at the output terminal OUT becomes equal to the voltage at the input terminal IN, the operation of each part becomes stable.

When the voltage at the input terminal IN drops from the balanced state between the voltage at the input terminal IN and the voltage at the output terminal OUT, the operation of each part is carried out in the opposite way. While the drain current of NMOS transistor 24, used as a current sink, increases, the drain current of PMOS transistor 28, used for charging, decreases, and the load is discharged by NMOS transistor 24. When the voltage at the output terminal OUT becomes equal to the voltage at the input terminal IN, the operation of each part becomes stable.

Applications requiring high-speed operational amplifiers have increased in recent years. For example, in a source driver, which drives the signal lines of a liquid-crystal display (LCD), a signal line load equivalent to tens of pF must be charged/discharged stably and reliably during the time of one horizontal scanning period (although the time varies depending on the panel system, it is about 18 $\mu$s for an XGA panel with 1024×768 pixels). Consequently, the operational amplifier used for the output buffer of the driver must have extremely high driving ability (rise and fall characteristics).

Conventionally, in order to increase the speed of an operational amplifier, the transistor size of each part in the operational amplifier is increased. This method, however, is undesirable because it conflicts with another important requirement, miniaturization of the operational amplifier and the chip. In the aforementioned source driver, since many, that is, about 400, operational amplifiers are incorporated on a single chip, the chip size is greatly affected by the size of the transistors making up the operational amplifiers. Also, if the size of the transistors in each part of the operational amplifier is increased, the pn junction capacitance, etc. will be increased, which becomes the main source of oscillation. In addition, the current consumption of each part and the current consumption of the entire operational amplifier are increased significantly.

One purpose of the present invention is to solve the aforementioned problems by providing a type of amplifier which can realize high-speed rise and/or fall characteristics without increasing the transistor size.

Another purpose of the present invention is to provide a type of amplifier which can realize high-speed rise and/or fall characteristics with little increase in current consumption.

Yet another purpose of the present invention is to provide a type of amplifier which can realize high-speed operation without affecting the characteristics (such as the anti-oscillation stability) in the regular state.

SUMMARY OF THE INVENTION

In order to realize the aforementioned purposes, the present invention provides an amplifier having a differential input part for differentially inputting a pair of input signals, an output part which amplifies and outputs the output signal of the aforementioned differential input part, a constant-current source circuit which is arranged in the aforementioned differential input part or the output part, a first transistor which is turned on when the voltage difference between either of the aforementioned input signals and the output signal of the aforementioned output part exceeds a prescribed value, and a second transistor which is turned on when the aforementioned first transistor is turned on and which adds the current that results from the on-state to the constant current generated by the aforementioned constant-current source circuit.

In the amplifier of the present invention, when the voltage of a prescribed input signal input to the differential input part is higher than the voltage of the output signal of the output part by a prescribed value, the first transistor is turned on. Preferably, the input signal is supplied to one of the terminals of the first transistor, and the output signal is supplied to the control terminal of the first transistor. When the voltage difference between the two signals exceeds the threshold value of the first transistor, the first transistor is turned on. It is also possible to supply the input signal to the control terminal of the first transistor and supply the output signal to one of the terminals of the first transistor. When the voltage difference between the two signals exceeds the threshold value of the first transistor, the first transistor is turned on.

The second transistor is also turned on when the first transistor is turned on. Preferably, there is a certain direct or indirect relationship between the conducting current of the first transistor and the conducting current of the second transistor. The conducting current to the second transistor is multiplexed with or added to the constant current generated by the constant-current source circuit and supplied to the active elements of the differential input part or output part. In this way, the operating speed of each part can be increased.

In the amplifier of the present invention, the second transistor used for increasing the speed can also function appropriately to realize the same current reinforcing effect as described above with respect to the charging current of a charging circuit or the discharging current of a discharging circuit in the differential input part or the output part instead of the constant current generated by the constant-current source circuit.

REFERENCE NUMERALS AND SYMBOLS AS SHOWN IN THE DRAWINGS

In the figure, 10 represents a differential input part, 12 an output part, 40 a main circuit, 42 a first sensing circuit, 44 a second sensing circuit, 46 a rise sensing PMOS transistor, 48, 50 NMOS transistors (current-mirror circuit), 52 a PMOS transistor for driving, 54 a fall sensing PMOS transistor, 56, 58 NMOS transistors (current-mirror circuit), 60 a PMOS transistor for driving, M a speed-up transistor, Io a constant-current source circuit, 64, 70 PMOS transistors for constant current source, 66, 72 PMOS transistors for rise speed up, 68, 74 PMOS transistors for fall speed up, 90 a main circuit, 92 a first sensing circuit, 94 a second sensing circuit, 96 a rise sensing PMOS transistor, 98 an NMOS transistor for driving, 100 a fall sensing PMOS transistor, 102 an NMOS transistor for driving.

DESCRIPTION OF THE EMBODIMENTS

In the following, a preferred embodiment of the present invention will be explained with reference to FIGS. 1–9.

Figure 1:
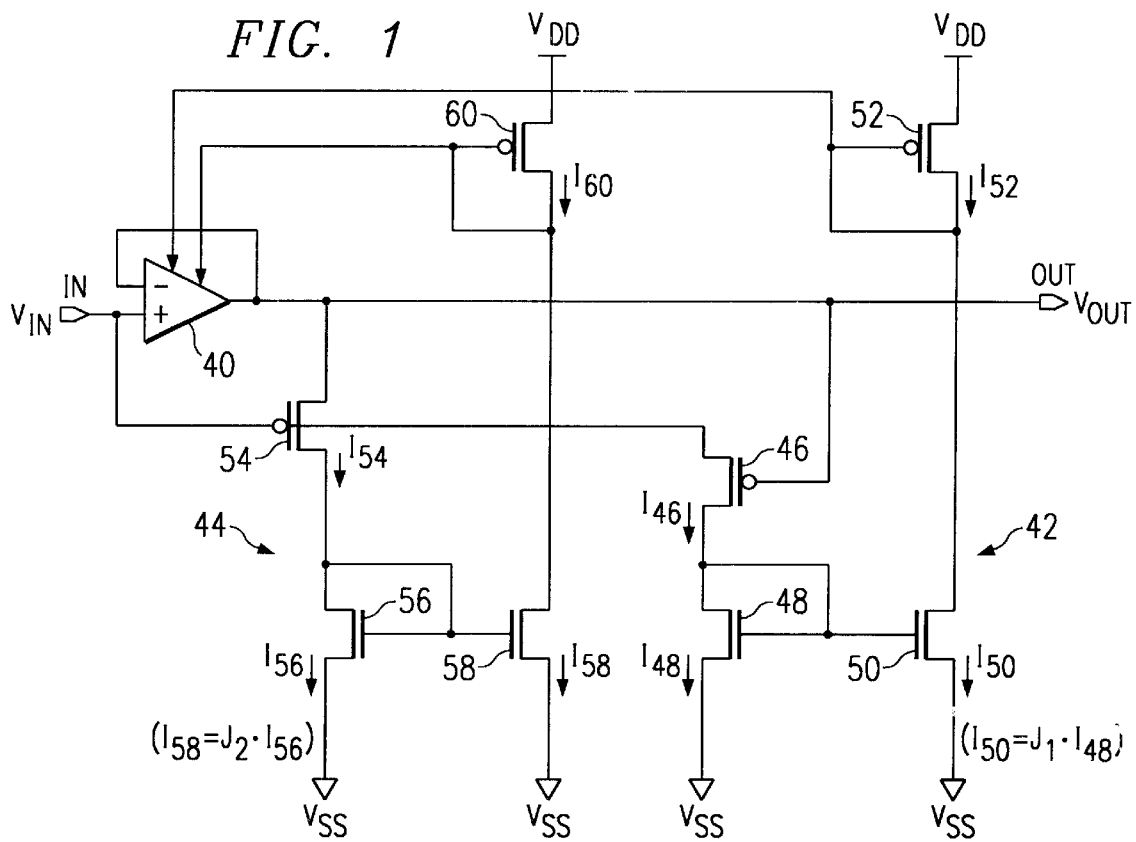
FIG. 1 is a circuit diagram illustrating the basic configuration of an operational amplifier disclosed in an embodiment of the present invention.
Figure 2:
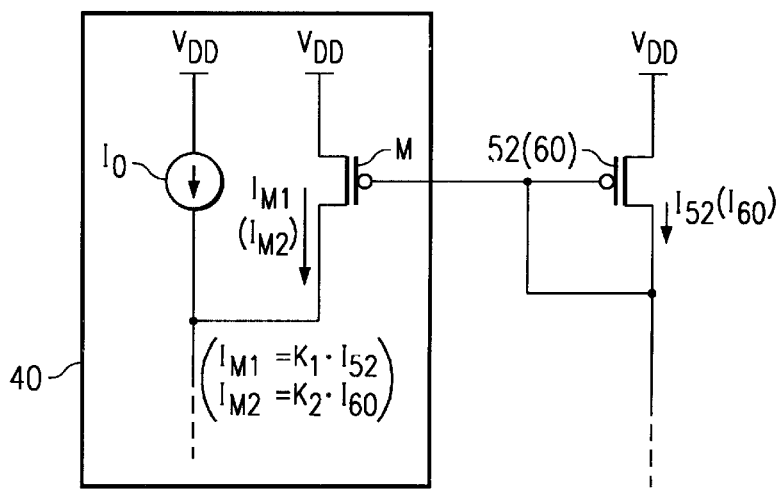
FIG. 2 is a circuit diagram illustrating the configuration of the main parts in the main circuit shown in FIG. 1.

FIGS. 1 and 2 show the basic configuration of the operational amplifier disclosed in an embodiment of the present invention. The operational amplifier acts as a voltage follower with the noninverting input terminal (+) directly connected to the signal input terminal IN and the signal output terminal OUT directly connected to the inverting input terminal (−). The main circuit 40 of the operational amplifier includes at least a differential input part, which has a pair of MOS transistors with the gate terminals connected to the noninverting input terminal (+) and the inverting input terminal (−), and an output part which amplifies and outputs the output signal of the differential input part. One or more constant-current source circuits are used to supply operating current to the prescribed transistors in the differential input part and/or the output part.

As shown in FIG. 2, in the present embodiment, the MOS transistors, such as PMOS transistors, used for speed up or increased gain are connected in parallel with each other with respect to a prescribed constant-current source circuit Io in main circuit 40.

In FIG. 1, a first rise sensing circuit 42 and a second fall sensing circuit 44 are connected to main circuit 40.

The first sensing circuit 42 has a PMOS transistor 46 which functions as a transistor for rise sensing, a pair of NMOS transistors 48 and 50 which constitute a current-mirror circuit, and a PMOS transistor 52 used for driving the PMOS transistor M used for speed up in main circuit 40.

More specifically, the input terminal IN is connected to the source terminal of PMOS transistor 46, and the output terminal OUT is connected to the gate terminal of PMOS transistor 46. The drain terminal of PMOS transistor 46 is connected to the drain terminal and the gate terminal of NMOS transistor 48. The gate terminals of two NMOS transistors 48 and 50 are connected to each other, and their source terminals are connected to the power supply voltage terminal $V_{SS}$ on the negative electrode side (for example, the ground potential). The drain terminal of NMOS transistor 50 is connected to the drain terminal and gate terminal of PMOS transistor 52, and the source terminal of PMOS transistor 52 is connected to the power supply voltage terminal $V_{DD}$ on the positive electrode side. As shown in FIG. 2, the gate terminal of PMOS transistor 52 is connected to the gate terminal of one of the PMOS transistors M used for speed up in main circuit 40. The two PMOS transistors 52 and M constitute a current-mirror circuit.

The second sensing circuit 44 has a PMOS transistor 54 which functions as a transistor for fall sensing, a pair of NMOS transistors 56 and 58 which constitute a current-mirror circuit, and a PMOS transistor 60 used for driving the PMOS transistor M used for speed up in main circuit 40.

More specifically, the input terminal IN is connected to the gate terminal of PMOS transistor 54, and the output terminal OUT is connected to the source terminal of PMOS transistor 54. The drain terminal of PMOS transistor 54 is connected to the drain terminal and gate terminal of NMOS transistor 56. The gate terminals of the two NMOS transistors 56 and 58 are connected to each other, and their source terminals are connected to the power supply voltage terminal $V_{SS}$ on the negative electrode side. The drain terminal of NMOS transistor 58 is connected to the drain terminal and gate terminal of PMOS transistor 60, and the source terminal of PMOS transistor 60 is connected to the power supply voltage terminal $V_{DD}$ on the positive electrode side. As shown in FIG. 2, the gate terminal of PMOS transistor 60 is connected to the gate terminal of one of the PMOS transistors M used for speed up in main circuit 40. The two PMOS transistors 60 and M constitute a current-mirror circuit.

When the two sensing circuits 42 and 44 are operated by the same constant-current source circuit Io, the two PMOS transistors M, M for speed up can be connected in parallel with respect to the constant-current source circuit Ia, and the gate terminals of the driving PMOS transistors 52 and 60 of the two sensing circuits 42 and 44 can be connected to the gate terminals of the two PMOS transistors M and M, respectively.

In this operational amplifier, the first sensing circuit 42 operates as follows. When the voltage Vin at the input terminal IN is higher than the voltage Vout at the output terminal OUT by more than the threshold voltage $V_{t46}$ of the PMOS transistor 46 used for rise sensing ($V_{in} > V_{out} + V_{t46}$), typically, during the rise of the input/output signal, PMOS transistor 46 is turned on.

At that time, a current $I_{50}$ ($J_1 \cdot I_{48}$), which has a certain magnification $J_1$ realized by the current-mirror effect with respect to the drain current $I_{48}$ of NMOS transistor 48, that is, with respect to the drain current $I_{46}$ of said PMOS transistor 46, flows through NMOS transistor 50. The magnification $J_1$, of the current can be selected appropriately depending on the ratio $W_{50}/W_{48}$ of the channel widths $W_{50}$ and $W_{48}$ of the two NMOS transistors 50 and 48. However, the two NMOS transistors 48 and 50 have the same channel length L.

The drain current $I_{50}$ of NMOS transistor 50 is the drain current $I_{52}$ of PMOS transistor 52. Consequently, a current $I_{M1}$ ($K_1 \cdot I_{52}$) with a certain ratio $K_1$, realized by the current-mirror effect with respect to the drain current $I_{52}$ of said PMOS transistor 52 flows through the PMOS transistor M used for speed up in main circuit 40. The magnification $K_1$, of the current can be selected appropriately depending on the ratio $W_M/W_{52}$ of the channel widths $W_M$ and $W_{52}$ of the two PMOS transistors M and 52. However, the two PMOS transistors 52 and M have the same channel length L.

In main circuit 40, the drain current $I_{M1}$ of the PMOS transistor M used for speed up is multiplexed with or added to the constant current generated by the constant-current source circuit Io and supplied to the-differential or amplification transistor of each part. In this way, the operating speed of each part is accelerated. Also, the speed with which the load (not shown in the figure) connected to the output terminal OUT is charged is increased, and the rise time is improved.

The second sensing circuit 44 operates as follows. When the voltage $V_{in}$ at the input terminal IN is less than the voltage $V_{out}$ at the output terminal OUT by more than the threshold voltage $V_{t54}$ of the PMOS transistor 54 used to sense signal fall ($V_{in} < V_{out} - V_{t54}$), typically, during the fall of the input signal/output signal, PMOS transistor 54 is turned on.

At that time, a current $I_{58}$ ($J_2 \cdot I_{56}$) having a certain magnification $J_2$ realized by the current-mirror effect with respect to the drain current $I_{56}$ of NMOS transistor 56, that is, with respect to the drain current $I_{54}$ of said PMOS transistor 54 flows through NMOS transistor 58. The magnification $J_2$ of the current can be selected appropriately depending on the ratio of $W_{58}/W_{56}$ between the channel widths $W_{58}$ and $W_{56}$ of the two NMOS transistors 58 and 56. However, the two NMOS transistors 58 and 56 have the same channel length L.

The drain current $I_{58}$ of NMOS transistor 58 is the drain current $I_{60}$ of PMOS transistor 60. Consequently, a current IM2 ($K_2 \cdot I_{60}$) with a certain ratio $K_2$ realized by the current-mirror effect with respect to the drain current $I_{60}$ of said PMOS transistor 60 flows through the PMOS transistor M used for speed up in main circuit 40. The magnification $K_2$ of the current can be selected appropriately depending on the ratio of $W_M/W_{60}$ between the channel widths $W_M$ and $W_{60}$ of the two PMOS transistors M NS 60. However, the two PMOS transistors M and 60 have the same channel length L.

In main circuit 40, the drain current $I_{M2}$ of the PMOS transistor M is multiplexed with or added to the constant current generated by the constant-current source circuit Io and supplied to the differential or amplification transistor of each part. In this way, the operating speed of each part is accelerated. Also, the speed at which the load discharged is increased, and the fall time is improved. Also, in this case, in sensing circuit 44, the PMOS transistor 54 and the NMOS transistor 56 which are in the on-state form a current path used for discharge. Since the drain currents $I_{54}$ ($I_{56}$) become part of the discharge current on the load side, the fall speed can be further improved.

When the potential difference between the input and output is less than the threshold values $V_{t46}$ and $V_{t54}$ of PMOS transistors 46 and 54 ($V_{in} - V_{out} < V_{t46}$, $V_{t54}$), that is, in the regular state or when the input only varies a little, said two sensing circuits 42 and 44 do not operate, and the PMOS transistor M used for speed up in main circuit 40 is kept in the off-state. Consequently, no current is consumed by the two aforementioned sensing circuits 42 and 44 or by the PMOS transistor M used for speed up in main circuit 40.

In the operational amplifier disclosed in the present embodiment, since the sensing circuits 42 and 44 as well as the transistor M used for speed up in main circuit 40 only operate when there is variation in the input/output signals, the rise and fall speed of the signals can be increased without increasing the current consumption. Also, since these circuits, especially, said sensing circuits 42 and 44, do not operate in the regular state with almost no potential difference between the input and output, the oscillation stability, etc. will not be affected. In addition, since said sensing circuit 42 or 44 will be turned on only when the potential difference between the input and output is greater than the threshold voltage $V_{t46}$, $V_{t54}$ of sensing transistors 46, 54, they can be made up of small transistors. Consequently, there is little influence on the size of the entire operational amplifier or on the chip size.

It is preferred to form the operational amplifier disclosed in the present embodiment as MOS integrated circuit on a p-type silicon substrate so that the influence of the substrate bias effect can be avoided by using PMOS transistors as sensing transistors 46 and 54. If NMOS transistors are used for said sensing transistors 46 and 54, the threshold voltage Vt becomes higher under the influence of the substrate bias effect. As a result, the potential difference between the input and output for operating sensing circuits 42 and 44 will increase correspondingly. The effect of the present invention on increasing operating speed will be compromised.

However, if the rise sensing transistor 46 is a PMOS transistor, since its source terminal is connected to the input terminal IN, a small drain current will flow from the input terminal IN to said transistor 46. As a result, the input signal of the operational amplifier will be affected. Nevertheless, this problem can be solved by using the current restricting method (to be described below). If there is P-TANK with a twin well process, an NMOS transistor can be used for the rise sensing transistor 46, and the influence on the input signal can be avoided.

Figure 3:
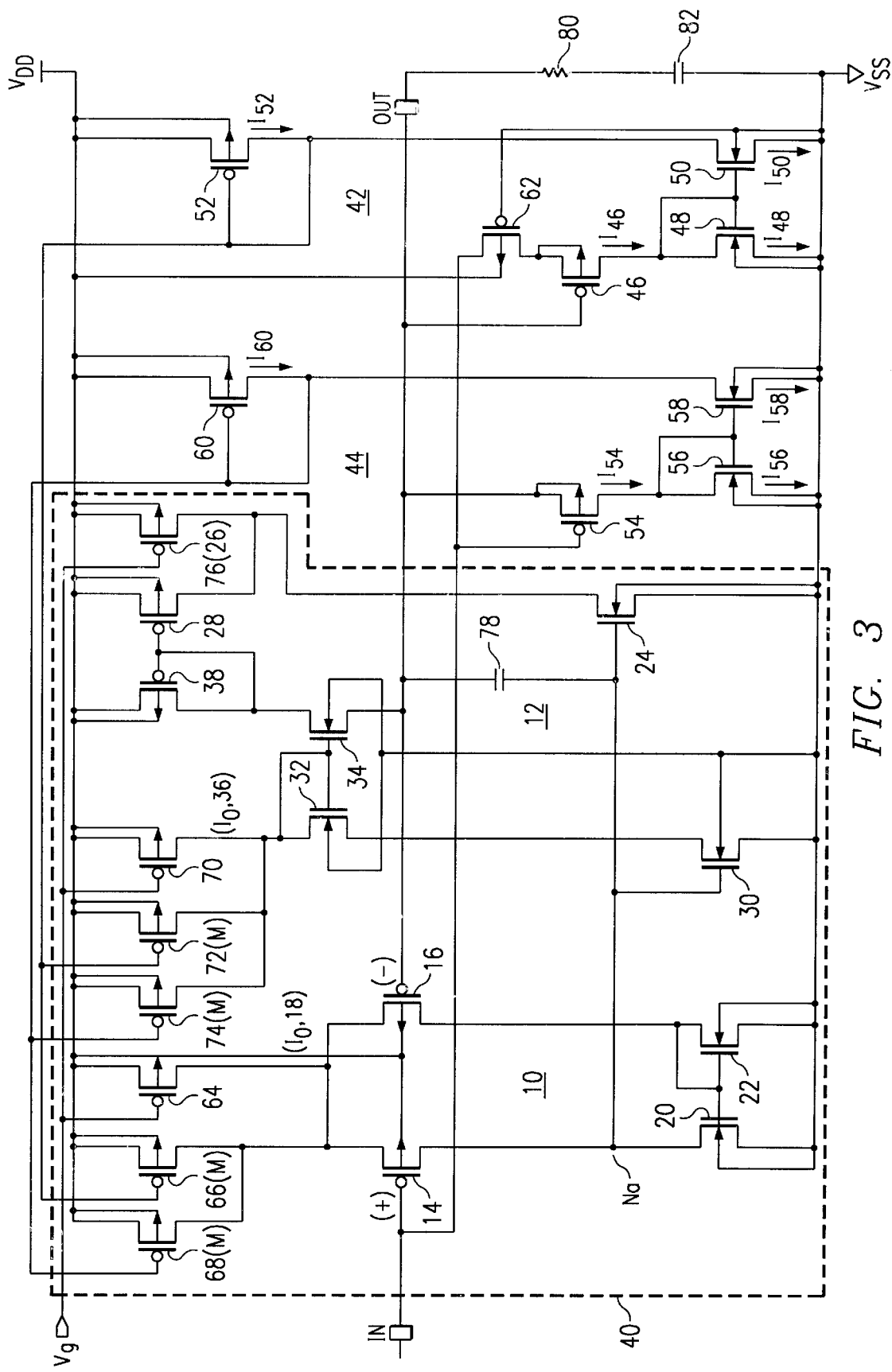
FIG. 3 is a circuit diagram illustrating a detailed configuration example of the operational amplifier disclosed in the present embodiment.

FIG. 3 shows a detailed example of the constitution of the operational amplifier disclosed in the present embodiment. In this figure, the same reference numerals are assigned to the same or corresponding parts of FIG. 1. Also, in this constitutional example, since part of main circuit 40 has the same constitution and function as that shown in FIG. 10, the same reference numerals for the same or corresponding parts shown in FIG. 10 will be used.

In the constitutional example shown in FIG. 3, the operational amplifier disclosed in the present embodiment is constituted with a CMOS circuit and functions as a sink-type voltage follower. The power supply voltage $V_{DD}$ on the positive electrode side is supplied as a back bias to all of the PMOS transistors except for PMOS transistors 46 and 54 used for rise and fall sensing. The power supply voltage $V_{SS}$ on the negative electrode side is supplied as a back bias to all of the NMOS transistors.

In the first sensing circuit 42, PMOS transistor 62, which is connected in series between the input terminal IN and the rise sensing PMOS transistor 46 has its gate terminal connected to the power supply voltage $V_{SS}$ on the negative electrode side and functions as a resistor. During the operation of sensing circuit 42, the input signal will be affected when the drain current $I_{46}$ of PMOS transistor 46 increases. Consequently, the drain current 146 of PMOS transistor 46 is restricted by PMOS transistor 62 which acts as a resistor so as to avoid the influence with respect to the input signal. Of course, it is also possible to restrict the current by reducing the size of PMOS transistor 46 or NMOS transistor 48.

In the differential input part of main circuit 40, the source terminal of PMOS transistor 64 is connected to the power supply voltage $V_{DD}$, the drain terminal is connected to the source terminals of the two PMOS transistors 14 and 16 with their drain terminals differentially connected, and the gate terminal is connected to a certain bias voltage Vg to form constant-current source circuit Io 18. The two PMOS transistors 66 and 68 which are connected in parallel with PMOS transistor 64 of the constant-current source correspond to the transistors M used for speed up shown in FIG. 2. The gate terminal of PMOS transistor 66 is connected to the gate terminal of PMOS transistor 52 used for driving the first sensing circuit 42. The gate terminal of PMOS transistor 68 is connected to the gate terminal of PMOS transistor 60 used for driving the second sensing circuit 44.

In the output control part of main circuit 40, the source terminal of PMOS transistor 70 is connected to the power supply voltage $V_{DD}$, the drain terminal is connected to the gate terminal of two NMOS transistors 32 and 34, and the gate terminal is connected to the aforementioned bias voltage Vg to form a constant-current source circuit Io 36. A pair of PMOS transistors 72 and 74, which are connected in parallel with the PMOS transistor 70 of the constant current source, also correspond to the transistors M used for speed up. The gate terminal of PMOS transistor 72 is connected to the gate terminal of PMOS transistor 52 used for driving the first sensing circuit 42. The gate terminal of another PMOS transistor 74 is connected to the gate terminal of PMOS transistor 60 used for driving the second sensing circuit 44.

In the output part of main circuit 40, the source terminal of PMOS transistor 76 is connected to the power supply voltage $V_{DD}$, the drain terminal is connected to the output terminal OUT, and the gate terminal is connected to the aforementioned bias voltage Vg to form a constant-current source circuit 26 for load charging. Capacitor 78, which is connected between the gate terminal and drain terminal of NMOS transistor 24 used as a current sink, is used for phase compensation.

For example, when the operational amplifier of the voltage follower is used as the output buffer of a LCD source driver, the load connected to the output terminal OUT comprises signal lines, thin-film transistors, and liquid-crystal pixels and can be represented by an equivalent circuit comprising resistor 80 and capacitor 82.

Figure 10:
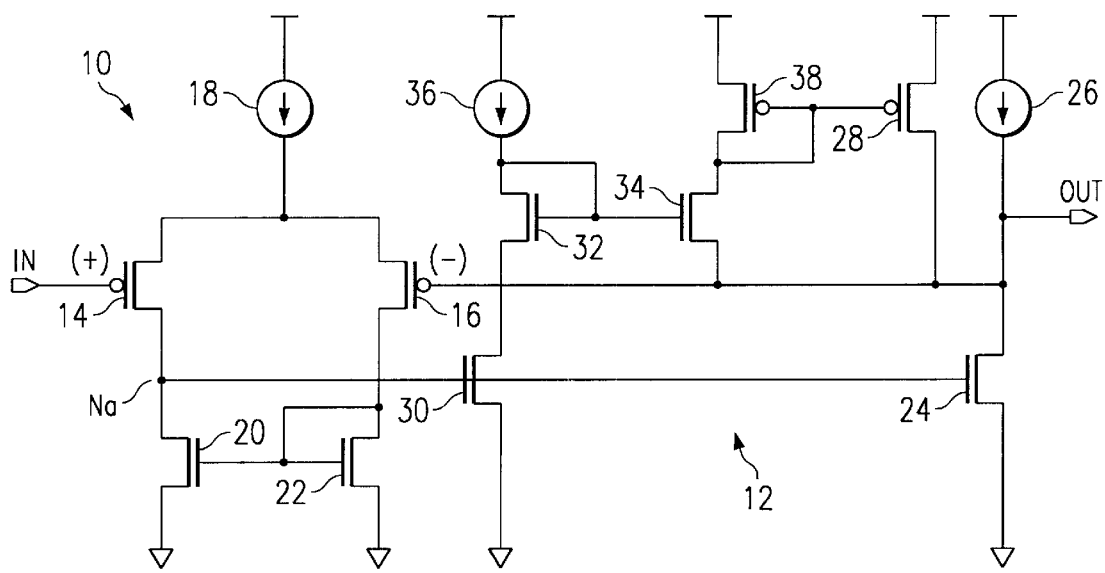
FIG. 10 is a circuit diagram illustrating the configuration of a conventional operational amplifier.
Figure 11:
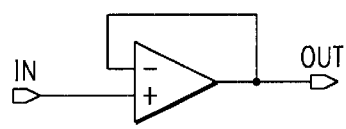
FIG. 11 is a diagram illustrating a voltage follower comprising operational amplifiers.

In this operational amplifier, the operation of main circuit 40 is basically identical to that of the operational amplifier shown in FIG. 10. However, the rise and fall speeds of the output signal are increased significantly depending on the operation of sensing circuits 42 and 44 as well as speed-up transistors 66, 72 and 68, 74.

That is, when the voltage at the input terminal IN rises from the balanced state between the voltage at the input terminal IN and the voltage at the output terminal OUT, the output signal of differential input part 10, that is, the potential at node Na, drops. In output part 12, the drain current of NMOS transistor 24, used as a current sink, is reduced, while the drain current of PMOS transistor 28, used for load charging, is increased via the output control part. At that time, in the first sensing circuit 42, if the potential difference between the input and output is greater than the threshold value $V_{t46}$ of PMOS transistor 46, transistors 46–52 will operate as described above. The PMOS transistors 66 and 72 used for speed up in main circuit 40 will be turned on, and their drain currents will be multiplexed with or added to the constant currents generated by constant-current source circuits 18 and 36, respectively. In this way, the gain of differential input part 10 and of output part 12 can be improved, and the operating speed can be increased.

When the voltage at the input terminal IN drops from the balanced state between the voltage at the input terminal IN and the voltage at the output terminal OUT, the output signal of differential input part 10, that is, the potential at node Na, rises. In output part 12, the drain current of the NMOS transistor 24, used as a current sink, is increased, while the PMOS transistor 76 used for load charging is reduced via the output control part. At that time, in the second sensing circuit 44, if the potential difference between the input and output is greater than the threshold value $V_{t54}$ of PMOS transistor 54, transistors 56–60 will operate as described above. The PMOS transistors 68 and 74 used for speed up in main circuit 40 will be turned on, and their drain currents will be multiplexed with or added to the constant currents generated by constant-current source circuits 18 and 36, respectively. In this way, the gain of differential input part 10 and of output part 12 can be improved, and the operating speed can be increased.

As a variant of the present embodiment, the PMOS transistor M, used for rise speed up in main circuit 40 driven by the first sensing circuit 42, can also be connected in parallel with the constant-current source circuit 26, used for charging in output part 12. Also, the PMOS transistor M, used for fall speed up in main circuit 40 driven by the second sensing circuit 44, can be connected in parallel with NMOS transistor 24, used as a current sink. In the operational amplifier, the speed-up transistors disclosed in the present invention can be connected in parallel not only with the constant-current source circuit but also with various types of charging or discharging circuits. The operating speed can be increased by increasing the discharge or charge current.

Figure 4:
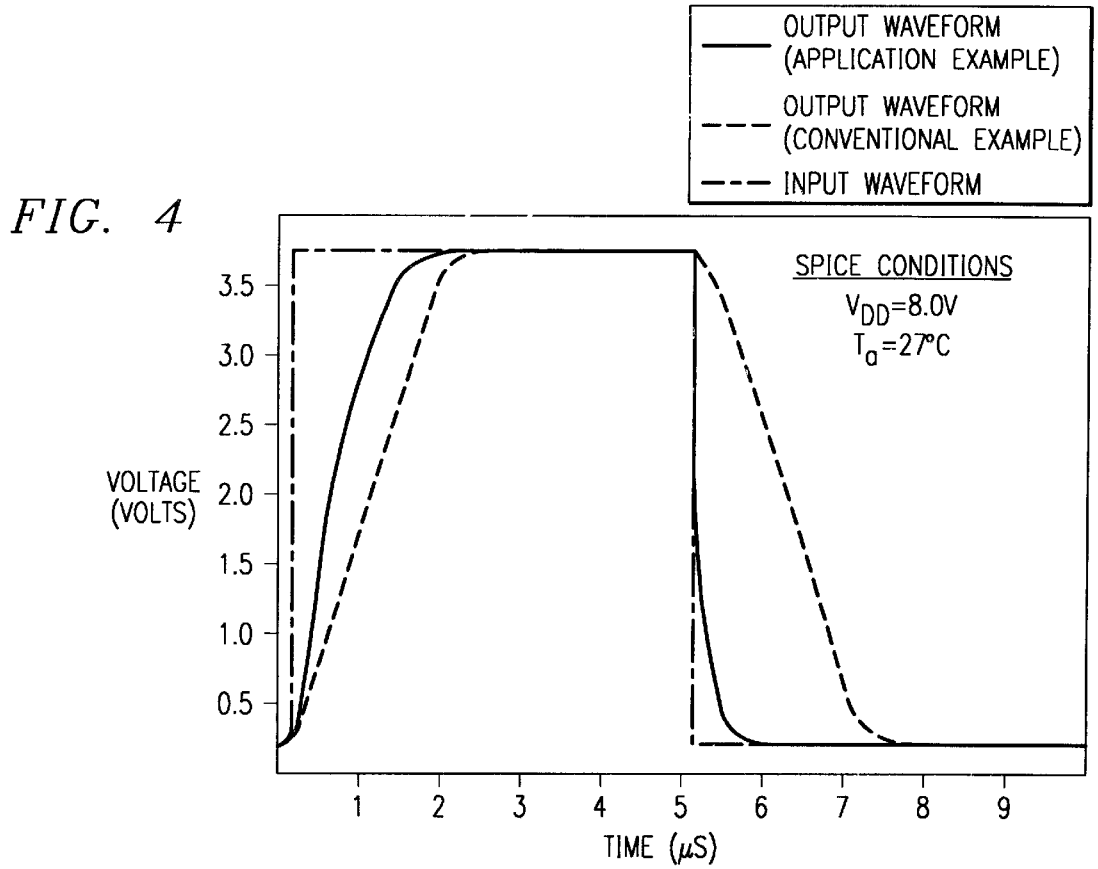
FIG. 4 is a diagram comparing an example of the input/output voltage characteristics of the operational amplifier disclosed in the present embodiment with a conventional example.

FIG. 4 shows a comparison of an example of the input/output voltage characteristic of the operational amplifier shown in FIG. 3 with the conventional example (FIG. 10). The data are obtained by means of SPICE simulation. It shows the waveform of an output signal obtained at the output terminal OUT when a pulse signal with a pulse width of about 5 μs and an amplitude of about 3.8 V is input to the input terminal IN. As shown in the figure, the effect on shortening the rise time and fall times in the present application example is significant. In particular, the effect on shortening the fall time is significant because, as described above, the second sensing circuit 44, which operates during the fall of a signal, provides a current path for load discharging.

Figure 5:
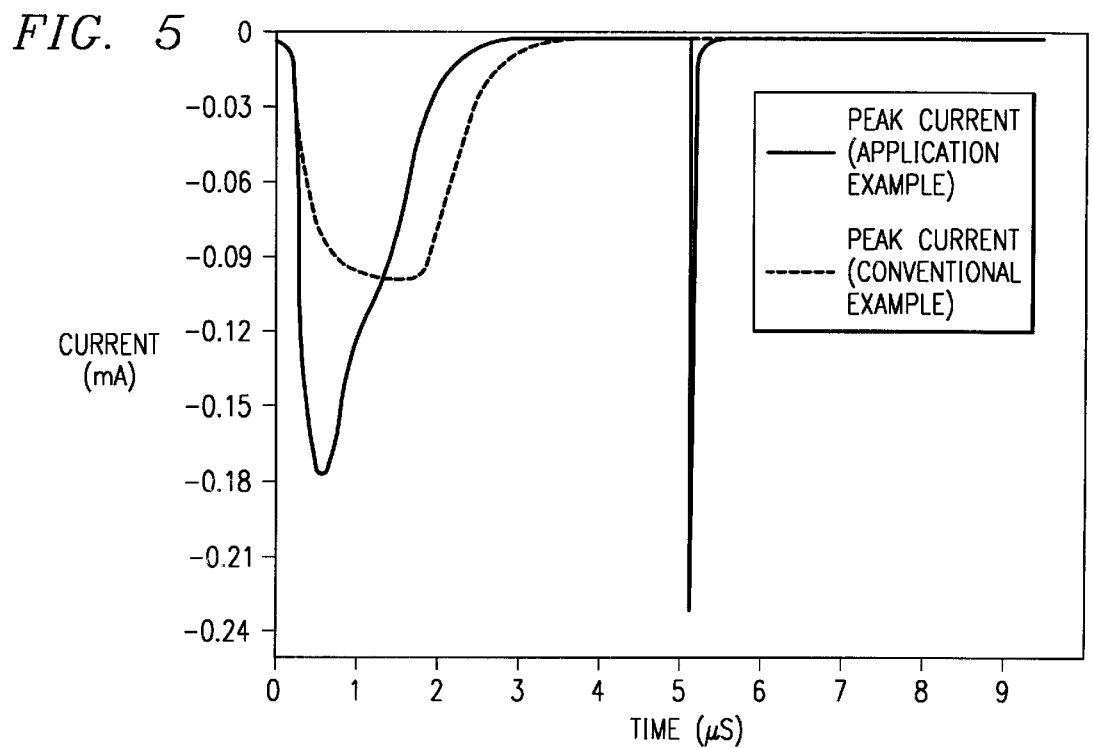
FIG. 5 is a diagram illustrating the peak current characteristic corresponding to the input/output waveform shown in FIG. 4 for the operational amplifier disclosed in the present embodiment.
Figure 6:
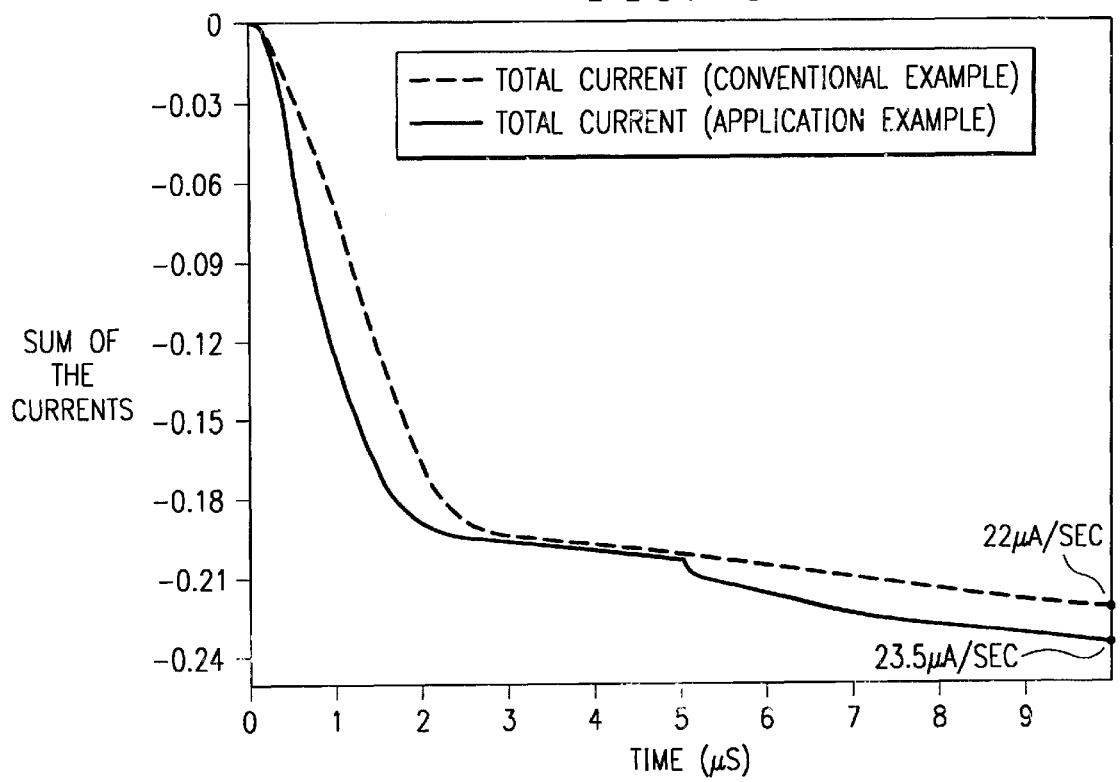
FIG. 6 is a diagram illustrating the characteristic of the total current (integrated value) corresponding to the input/output waveform shown in FIG. 4 for the operational amplifier disclosed in the present embodiment.

FIGS. 5 and 6 show the characteristics of the peak current, that is, the consumed current and the total current (integrated value) with respect to the input/output waveform shown in FIG. 4. These data are also obtained by means of SPICE simulation. The currents are negative (−) in sign since they are the drain currents of the PMOS transistors. As shown in the figures, in the application example, although the current consumption increases when sensing circuits 12 and 14 as well as the speed-up transistors 66,72 and 68,74 operate during rise and fall times, the current consumption does not increase at other times. Also, as shown in FIG. 6, in the application example, the increased current consumption is 23.5 μA/s, which is only slightly larger than 22 μA/s of the conventional example. For example, when the operational amplifier disclosed in the aforementioned embodiment is used as an LCD source driver, since one rise/fall cycle takes about 18 μs (one horizontal scanning period) for an XGA panel, the current consumption is about 6.5 μA/s in the application example, which represents very little increase compared with the conventional example (about 6.1 μA/s).

Figure 7:
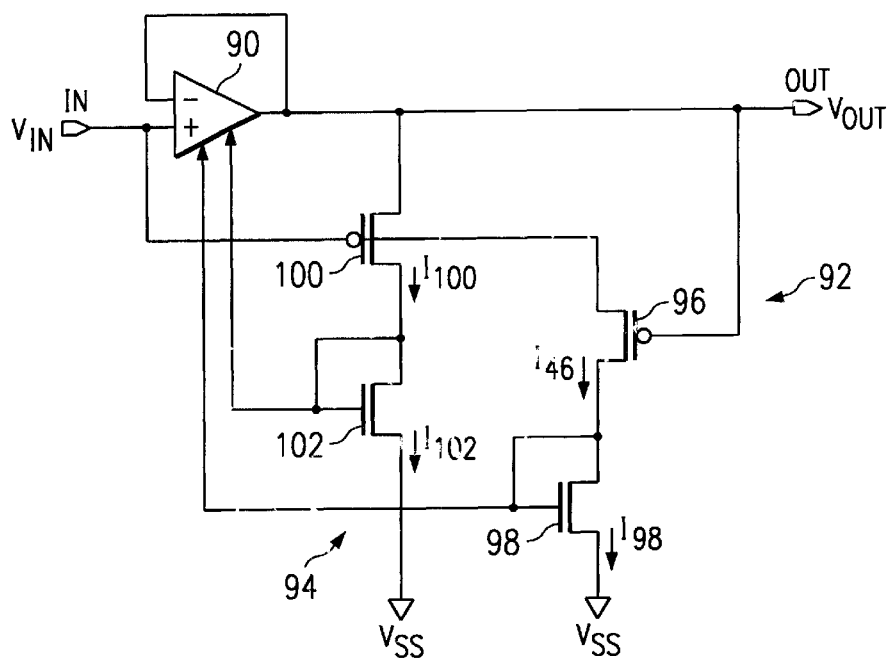
FIG. 7 is a circuit diagram illustrating the basic configuration of an operational amplifier disclosed in another embodiment.
Figure 8:
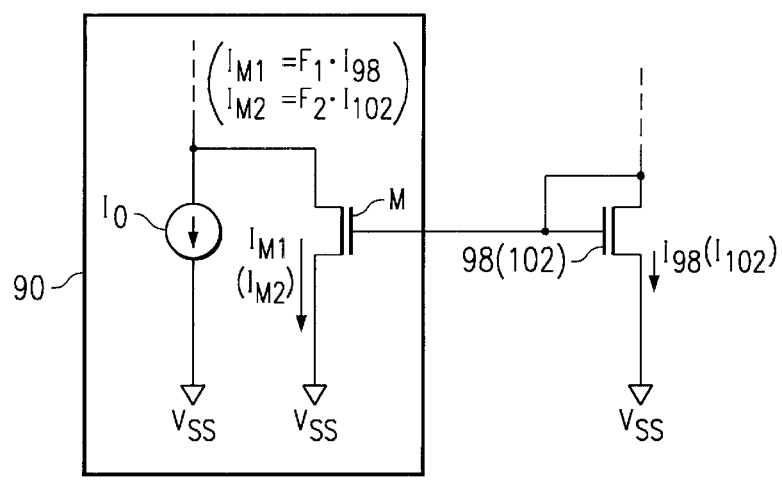
FIG. 8 is a circuit diagram illustrating the configuration of the main parts in the main circuit shown in FIG. 7.

FIGS. 7 and 8 show the basic configuration of an operational amplifier disclosed in another embodiment of the present invention. The main circuit 90 of this operational amplifier is constituted as a source-type voltage follower. The first rise sensing circuit 92 and the second fall sensing circuit 94 connected to the main circuit are modified correspondingly.

The first sensing circuit 92 has a PMOS transistor 96 which functions as a rise sensing transistor and an NMOS transistor 98 which is used to drive an NMOS transistor M for speed up or increased gain in main circuit 90.

More specifically, the input terminal IN is connected to the source terminal of PMOS transistor 96, and the output terminal OUT is connected to the gate terminal of PMOS transistor 96. The drain terminal of PMOS transistor 96 is connected to the drain terminal and gate terminal of NMOS transistor 98. The source terminal of NMOS transistor 98 is connected to the power supply voltage terminal $V_{SS}$ on the negative electrode side (for example, ground potential), and the gate terminal is connected to the gate terminal of either of the NMOS transistors M used for speed up in main circuit 90 as shown in FIG. 8. The two NMOS transistors 98 and M form a current-mirror circuit.

The second sensing circuit 94 has a PMOS transistor 100, which functions as a fall sensing transistor, and an NMOS transistor 102, which is used to drive an NMOS transistor M, used for speed up in main circuit 90.

More specifically, the input terminal IN is connected to the gate terminal of PMOS transistor 100, and the output OUT is connected to the source terminal of PMOS transistor 100. The drain terminal of PMOS transistor 100 is connected to the drain terminal and gate terminal of NMOS transistor 102. The source terminal of NMOS transistor 102 is connected to the power supply voltage $V_{SS}$, and the gate terminal is connected to the gate circuit of either of the NMOS transistors M used for speed up in main circuit 90 as shown in FIG. 8. The two NMOS transistors 102 and M form a current-mirror circuit.

In this operational amplifier, the first sensing circuit 92 operates as follows. When the voltage Vin at the input terminal IN is higher than the voltage Vout at the output terminal OUT by more than the threshold voltage $V_{t96}$ of the PMOS transistor 96 used for rise sensing ($V_{in} => V_{out} + V_{t96}$), typically, during rise of the input/output signal, PMOS transistor 96 is turned on, and drain current $I_{96}$ flows.

The drain current $I_{96}$ of PMOS transistor 96 is the drain current $I_{98}$ of NMOS transistor 98. A current $I_{M1}$ ($F_1 \cdot I_{98}$) having a certain ratio $F_1$ realized by the current-mirror effect with respect to the drain current $I_{98}$ of NMOS transistor 98 flows through the NMOS transistor M used for speed up in main circuit 90. The magnification $F_1$ of the current can be selected appropriately depending on the ratio of $W_M/W_{98}$ between the channel widths $W_M$ and $W_{98}$ of the two NMOS transistors M and 98. However, the two NMOS transistors 98 and M have the same channel length L.

In main circuit 90, the drain current $I_{M1}$ of NMOS transistor M is multiplexed with or added to the constant current generated by the constant-current source circuit Io and supplied to the differential or amplification transistors of each part. In this way, the operating speed of each part is accelerated. Also, the speed of charging the load (not shown in the figure) connected to the output terminal OUT is increased, and the rise time is improved.

The second sensing circuit 94 operates as follows. When the voltage Vin at the input terminal IN is less than the voltage Vout at the output terminal OUT by more than the threshold voltage $V_{t100}$ of the PMOS transistor 100 used for fall sensing ($V_{in} < V_{out} - V_{t100}$), typically, during the fall of the input signal/output signal, PMOS transistor 100 is turned on, and drain current $I_{100}$ flows.

The drain current $I_{100}$ of PMOS transistor 100 is the drain current $I_{102}$ of NMOS transistor 102. A current $I_{M2}$ ($F_2 \cdot I_{102}$) having a certain ratio $F_2$ realized by the current-mirror effect with respect to the drain current $I_{102}$ of NMOS transistor 102 flows through NMOS transistor M used for speed up in main circuit 90. The magnification $F_2$ of the current can be selected appropriately depending on the ratio of $W_M/W_{102}$ between the channel widths $W_M$ and $W_{102}$ of the two NMOS transistors M and 102. However, the two NMOS transistors 102 and M have the same channel length L.

In main circuit 90, the drain current $I_{M2}$ of the NMOS transistor M is multiplexed with or added to the constant current generated by the constant-current source circuit Io and supplied to the differential or amplification transistor of each part. In this way, the operating speed of each part is accelerated. Also, the speed with which the load (not shown in the figure) connected to the output terminal OUT is charged is increased, and the fall time is improved.

Figure 9:
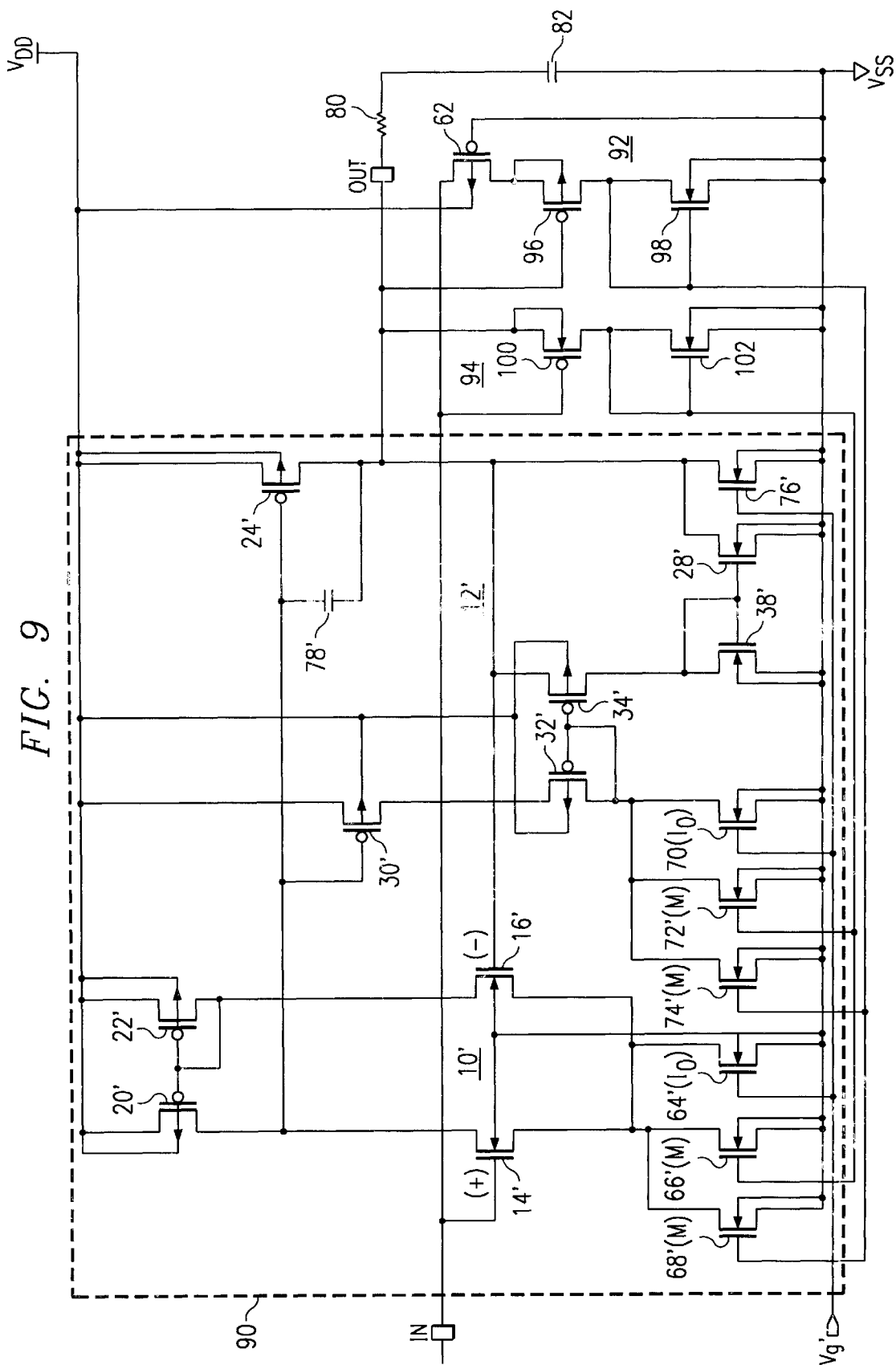
FIG. 9 is a circuit diagram illustrating a detailed configuration example of the operational amplifier disclosed in another embodiment.

FIG. 9 shows a detailed configuration example of the operational amplifier shown in FIG. 8. In this case, main circuit 90 is obtained by replacing every PMOS transistor in main circuit 40 shown in FIG. 3 with an NMOS transistor and replacing every NMOS transistor with a PMOS transistor. The main circuit has the same function as the main circuit 40 shown in FIG. 3 except that it is changed from sink mode to source mode. Consequently, a mark "'" is attached to the same reference numerals for the parts which functionally correspond to the parts shown in FIG. 3. Their detailed explanation is omitted.

The configuration of the main circuits 40 and 90 shown in FIGS. 3 and 9 are only one example. Various circuit configurations are possible. For example, the rail-to-rail output type configuration is also possible. The configuration of the sensing circuits 42, 44 and 92, 94 disclosed in the aforementioned embodiments is also just an example. Various modifications can be made. It is also possible to adopt a sensing circuit which is only used to sense either signal rise or fall. Although the aforementioned embodiments pertain to voltage followers, the present invention can be applied to various types of operational amplifiers. Theoretically, the amplifier of the present invention can also have a configuration which does not feed back the output signal of the output part to the differential input part.

As explained above, the amplifier of the present invention can realize high-speed operation, especially, high-speed rise and/or fall characteristics without increasing the transistor size, with little increase in current consumption, and without affecting the characteristics in the regular state.

What is claimed is:

1. An amplifier having a differential input part for differentially inputting a pair of input signals,
    an output part which amplifies and outputs the output signal of the differential input part,
    a constant-current source circuit which is arranged in the differential input part or the output part,
    a first transistor which is turned on when the voltage difference between either of the input signals and the output signal of the output part exceeds a prescribed value, and
    a second transistor which is turned on when the first transistor is turned on and which adds the current that results from the on-state to the constant current generated by the constant-current source circuit.

2. The amplifier described in claim 1 wherein the output terminal of the output part is electrically connected to either of the input terminals of the differential input part.

3. The amplifier described in claim 1 wherein one of the terminals of the first transistor is connected to one of the input terminals of the differential input part, and the control terminal of the first transistor is connected to the output terminal of the aforementioned output part.

4. The amplifier described in claim 1 wherein one of the terminals of the first transistor is connected to the output terminal of the output part, and the control terminal of the first transistor is connected to one of the input terminals of the differential input part.

5. The amplifier described in claim 1 wherein the second transistor constitutes a current-mirror circuit together with the first transistor.

6. The amplifier described in claim 1 wherein a third transistor which constitutes a first current-mirror circuit together with the second transistor, and
    a fourth transistor which is connected in series with the first transistor and constitutes a second current-mirror circuit together with the third transistor.

7. The amplifier described in claim 4 wherein one of the terminals of the first transistor is connected to one of the input terminals of the differential input part, and the control terminal of the first transistor is connected to the output terminal of the aforementioned output part.

8. The amplifier described in claim 2 wherein one of the terminals of the first transistor is connected to the output terminal of the output part, and the control terminal of the first transistor is connected to one of the input terminals of the differential input part.

9. The amplifier described in claim 2 wherein a third transistor which constitutes a first current-mirror circuit together with the second transistor, and
    a fourth transistor which is connected in series with the first transistor and constitutes a second current-mirror circuit together with the third transistor.

10. The amplifier described in claim 3 wherein a third transistor which constitutes a first current-mirror circuit together with the second transistor, and
    a fourth transistor which is connected in series with the first transistor and constitutes a second current-mirror circuit together with the third transistor.

11. An amplifier having a differential input part for differentially inputting a pair of input signals,
    an output part which amplifies and outputs the output signal of the differential input part,
    a charging circuit which is arranged in the differential input part or the output part,
    a first transistor which is turned on when the voltage difference between either of the input signals and the output signal of the output part exceeds a prescribed value, and
    a second transistor which is turned on when the first transistor is turned on and which adds the current that results from the on-state to the charging current generated by the charging circuit.

12. The amplifier described in claim 11 wherein the output terminal of the output part is electrically connected to either of the input terminals of the differential input part.

13. The amplifier described in claim 11 wherein one of the terminals of the first transistor is connected to one of the input terminals of the differential input part, and the control terminal of the first transistor is connected to the output terminal of the aforementioned output part.

14. The amplifier described in claim 11 wherein one of the terminals of the first transistor is connected to the output terminal of the output part, and the control terminal of the first transistor is connected to one of the input terminals of the differential input part.

15. The amplifier described in claim 11 wherein a third transistor which constitutes a first current-mirror circuit together with the second transistor, and
    a fourth transistor which is connected in series with the first transistor and constitutes a second current-mirror circuit together with the third transistor.

16. An amplifier having a differential input part for differentially inputting a pair of input signals,
    an output part which amplifies and outputs the output signal of the differential input part,
    a discharging current circuit arranged in the differential input part or output part,
    a first transistor which is turned on when the voltage difference between either of the input signals and the output signal of the output part exceeds a prescribed value, and
    a second transistor which is turned on when the first transistor is turned on and which adds the current that results from the on-state to the discharging current generated by the discharging current circuit.

17. The amplifier described in claim 16 wherein the output terminal of the output part is electrically connected to either of the input terminals of the differential input part.

18. The amplifier described in claim 16 wherein one of the terminals of the first transistor is connected to one of the input terminals of the differential input part, and the control terminal of the first transistor is connected to the output terminal of the aforementioned output part.

19. The amplifier described in claim 16 wherein one of the terminals of the first transistor is connected to the output terminal of the output part, and the control terminal of the first transistor is connected to one of the input terminals of the differential input part.

20. The amplifier described in claim 16 wherein a third transistor which constitutes a first current-mirror circuit together with the second transistor, and a fourth transistor which is connected in series with the first transistor and constitutes a second current-mirror circuit together with the third transistor.

\* \* \* \* \*